US009735177B2

United States Patent
Li et al.

(10) Patent No.: US 9,735,177 B2
(45) Date of Patent: Aug. 15, 2017

(54) ARRAY SUBSTRATE, METHOD FOR MANUFACTURING THE SAME AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui Province (CN)

(72) Inventors: Dengtao Li, Beijing (CN); Jaemoon Chung, Beijing (CN); Jaeyun Jung, Beijing (CN); Daeyoung Choi, Beijing (CN); Shikai Wang, Beijing (CN); Dongseob Kim, Beijing (CN); Jun Geng, Beijing (CN); Shiwei Lv, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 65 days.

(21) Appl. No.: 14/368,729

(22) PCT Filed: Dec. 13, 2013

(86) PCT No.: PCT/CN2013/089350
§ 371 (c)(1),
(2) Date: Jun. 25, 2014

(87) PCT Pub. No.: WO2015/024337
PCT Pub. Date: Feb. 26, 2015

(65) Prior Publication Data
US 2015/0053988 A1  Feb. 26, 2015

(30) Foreign Application Priority Data

Aug. 23, 2013  (CN) .......................... 2013 1 0373621

(51) Int. Cl.
*H01L 21/768* (2006.01)
*H01L 27/12* (2006.01)
(Continued)

(52) U.S. Cl.
CPC .... *H01L 27/1214* (2013.01); *H01L 21/02063* (2013.01); *H01L 21/76814* (2013.01);
(Continued)

(58) Field of Classification Search
CPC ................... H01L 21/02063; H01L 21/76814
See application file for complete search history.

(56) References Cited

U.S. PATENT DOCUMENTS 6,020,644 A * 2/2000 Tanigawa .......... H01L 27/10885
257/296
2004/0126608 A1  7/2004 Gotoh et al.
(Continued)

FOREIGN PATENT DOCUMENTS

CN  1120077 A  4/1996
CN  1503838  6/2004
(Continued)

OTHER PUBLICATIONS

Office Action in Chinese Patent Application No. 201310373621.X, dated Jan. 14, 2016.
(Continued)

*Primary Examiner* — Evan Pert
(74) *Attorney, Agent, or Firm* — Baker Hostetler LLP

(57) ABSTRACT

The present invention provides an array substrate, a method for manufacturing the same and a display device, and relates to technical field of displays. The method for manufacturing an array substrate comprises forming a metal layer on a substrate and removing superficial metallic oxide on the metal layer by a washing process. The method for manufacturing an array substrate according to the present inver-
(Continued)

sion can remove the superficial metal oxide on the metal layer and improve the performance of a TFT.

8 Claims, 4 Drawing Sheets

(51) Int. Cl.
*H01L 21/02* (2006.01)
*H01L 29/45* (2006.01)
*H01L 29/49* (2006.01)
*H01L 29/66* (2006.01)

(52) U.S. Cl.
CPC ........ *H01L 27/1244* (2013.01); *H01L 29/458* (2013.01); *H01L 29/4908* (2013.01); *H01L 29/66765* (2013.01)

(56) References Cited

U.S. PATENT DOCUMENTS

| | | | |
|---|---|---|---|
| 2006/0110866 A1* | 5/2006 | Gan | H01L 29/4908 438/151 |
| 2009/0142867 A1 | 6/2009 | Fujikawa et al. | |
| 2011/0008640 A1 | 1/2011 | Goto et al. | |
| 2012/0161138 A1 | 6/2012 | Okumoto et al. | |
| 2013/0083280 A1 | 4/2013 | Liu et al. | |

FOREIGN PATENT DOCUMENTS

| | | |
|---|---|---|
| CN | 1519897 | 8/2004 |
| CN | 1622297 | 6/2005 |
| CN | 102656671 | 9/2012 |
| CN | 102751240 | 10/2012 |
| CN | 103208491 | 7/2013 |
| CN | 103236440 A | 8/2013 |
| CN | 103441129 | 12/2013 |

OTHER PUBLICATIONS

Extended European Search Report in European Patent Application No. 13868477.8, dated Dec. 8, 2015.
Office Action in Chinese Patent Application No. 201310373621.X, dated Sep. 30, 2015.
First Office Action issued in corresponding Chinese Application No. 201310373621.X dated May 14, 2015.
International Search Report and Written Opinion issued in corresponding International Application No. PCT/CN2013/089350 dated Jun. 5, 2014.

* cited by examiner

Fig. 1: prior art

ARRAY SUBSTRATE, METHOD FOR MANUFACTURING THE SAME AND DISPLAY DEVICE

CROSS-REFERENCE TO RELATED APPLICATION

This application is the U.S. national phase of PCT Application No. PCT/CN2013/089350 filed on Dec. 13, 2013, which claims priority to Chinese Patent Application No. 201310373621.X filed on Aug. 23, 2013, the disclosures of which are incorporated in their entirety by reference herein.

TECHNICAL FIELD

The present invention relates to the technical field of displays, and in particular, relates to an array substrate and a method for manufacturing the same and a display device.

BACKGROUND

With the continuous progress of science and technology and the ever-growing need of liquid crystal display device, TFT-LCD (Thin Film Transistor-Liquid Crystal Display) has become the mainstream display used in the products such as cell-phone and panel computer, etc.

The performance of thin film transistor (TFT) determines the display quality of liquid crystal display. The existing TFT array substrate generally comprises in turn a base substrate, a common electrode, a gate electrode, a gate insulation layer, a semiconductor layer, an ohmic contact layer, a source electrode and a drain electrode, and a passivation layer and a pixel electrode, wherein the gate electrode, the source electrode and the drain electrode are usually made of metal with better electric conductivity. In order to improve the electric conductivity of metal electrodes, the metal electrodes can be made of Cu or Cu alloy. However Cu is a kind of metal susceptible to oxidation. When the metal electrode is made of Cu or Cu alloy, a superficial cupric oxide layer is apt to be formed on the metal electrode, and thus the impedance of the metal electrode will be increased and the electric conductivity decreased. Moreover, it will lead to a rough surface of the metal electrode and peeling off of the insulation layer costing the metal electrode. Therefore the performance of the TFT will be seriously affected, and the display will fail to display normally. If the metal electrode is made of other kinds of metal such as silver, aluminum or alloy, the metal electrode is also apt to be oxidized and the performance of TFT will be adversely affected.

SUMMARY

The technical problem to be solved by the invention is to provide an array substrate and a method for manufacturing the same and a display device. The method for manufacturing the array substrate according to the present invention can remove the superficial metal oxide on the metal layer and thus improve the performance of TFT.

To solve the above-mentioned technical problem, embodiments of the present invention provide technical solutions as follows.

In one aspect, the present invention provides a method for manufacturing an array substrate comprising: forming a metal layer on a substrate, and removing the superficial metallic oxide on the metal layer by a washing process.

In the above-mentioned solutions, the washing process further comprises removing the superficial metallic oxide on the metal layer by washing the substrate on which the metal layer is formed with organic acid or ethanolamine solution.

In the above-mentioned technical solutions, the washing process is further performed at 25-40° C. for more than 30 seconds.

In the above-mentioned technical solutions, the metal layer is further a metal pattern formed by patterning a metal film by a patterning process.

In the above-mentioned technical solutions, the metal pattern further comprises a gate electrode and/or a source-drain electrode.

In the above-mentioned technical solutions, the method further comprises steps of:
  forming the metal film;
  forming the metal pattern comprising the gate electrode by a one-time patterning process; and
  removing the superficial metallic oxide on the metal pattern comprising the gate electrode by the washing process.

In the above-mentioned technical solutions, the method further comprises:
  forming the metal film;
  forming the metal pattern comprising a source-drain electrode by a one-time patterning process; and
  removing the superficial metallic oxide on the metal pattern comprising the source-drain electrode by the washing process.

In the above-mentioned technical solutions, the method further comprises steps of:
  providing a base substrate,
  forming a first transparent conduction layer and a first metal film on the base substrate,
  forming a pattern of the first transparent conduction layer comprising a common electrode and forming a pattern of the first metal film comprising a gate electrode, by a one-time patterning process,
  removing superficial metallic oxide on the pattern of the first metal film comprising the gate electrode by the washing process,
  forming a gate insulation layer, a semiconductor layer, an ohmic contact layer and a second metal film,
  forming a pattern of the semiconductor layer, a pattern of the ohmic contact layer and a pattern of the second metal film comprising the source-drain electrode,
  removing the superficial metallic oxide on the pattern of the second metal film comprising the source-drain electrode by a washing process,
  forming a passivation layer and forming a pattern of the passivation layer comprising a via hole by a one-time patterning process; and
  forming a second transparent conduction layer and forming a pattern of the second transparent conduction layer comprising a pixel electrode by a one-time patterning process, wherein the pixel electrode is connected with the drain electrode by the via hole.

In the above-mentioned technical solutions, the metal layer is made of at least one selected from a group consisting of Cu, Pt, Ru, Au, Ag, Mo, Cr, Al, Ta and W.

In another aspect one embodiment of the present invention provides an array substrate which is manufactured by the above-mentioned manufacturing method, wherein a surface of a metal layer of the array substrate is not coated with metallic oxide.

In the above-mentioned technical solution, the metal layer of the array substrate further comprises a gate electrode layer and/or a source-drain electrode layer of a thin film transistor.

In still another aspect, one embodiment of the present invention provides a display device which comprises the array substrate.

Embodiments of the present invention produce the following beneficial effects.

In the above-mentioned technical solutions, the superficial metallic oxide on the metal layer is removed by the washing process after the metal layer is formed, therefore it will not have any adverse effect on the electric conductivity of the metal layer. In addition, a smooth surface will be provided for the metal layer, and the insulation layer coating the metal layer will be difficult of peeling off. Thus the performance of TFT and the normal display of the display can be ensured.

REFERENCE

Figure 1:
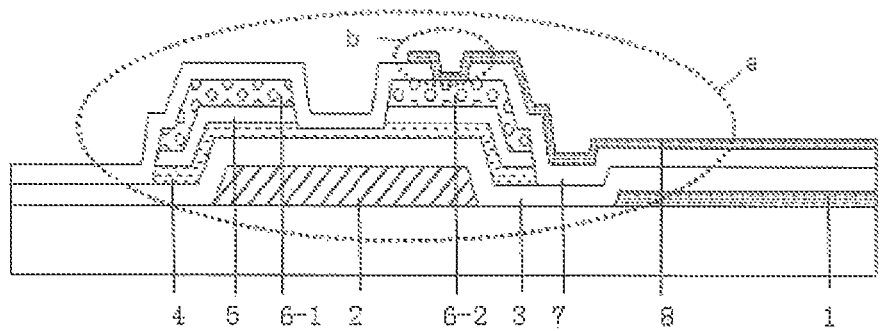
FIG. 1 is a schematic diagram showing a part of an array substrate in the prior art.

| | | |
|---|---|---|
| 1: a common electrode | 2: a gate electrode | 3: a gate insulation layer |
| 4: a semiconductor layer | 5: an ohmic contact layer | 6-1: a source electrode |
| 6-2: a drain electrode | 7: a passivation layer | 8 a pixel electrode |
| a: a TFT | b: a via hole | |

DETAILED DESCRIPTION

To make the technical problem to be solved, the technical solutions and the advantages of the present invention more apparent, hereinafter, the invention will be illustrated in detail in conjunction with the drawings and the following embodiments.

In the prior art, when the metal electrode is made of metal susceptible to oxidation, a superficial metallic oxide layer is apt to form on the metal electrode, and the impedance of the metal electrode will be increased and the electric conductivity decreased. Moreover, it will lead to a rough surface of the metal electrode and peeling off of the insulation layer coating the metal electrode. Therefore the performance of TFT will be seriously affected and the display will fail to display normally. In order to solve the above-mentioned technical problems, the embodiment of the present invention provides an array substrate and a method for manufacturing the same and a display device. The superficial metallic oxide on the metal layer can be removed and TFTs performance can be improved by the method for manufacturing the array substrate in the present invention.

One embodiment of the present invention provides a method for manufacturing an array substrate comprising: forming a metal layer on a substrate, and removing superficial metallic oxide on the metal layer.

Wherein, the substrate can be either a substrate on which no other film layer has been formed or a substrate on which other film layers have been formed. The metal layer can be made of single metal or alloy. Not only the metal layer is the metal electrode, but also the metal layer comprises signal lines, such as a gate line and a data line etc., which are formed simultaneously with the metal electrode being formed. The metal layer can be made of at least one selected from a group consisting of Cu, Pt, Ru, Au, Ag, Mo, Cr, Al, Ta and W.

In the method for manufacturing the array substrate of the present invention, the superficial metallic oxide on the metal layer is removed by a washing process after the metal layer is formed, therefore it will not have any adverse effect on the electric conductivity of the metal layer. In addition, a smooth surface will be provided for the metal layer, and the insulation layer coating on the metal layer will be difficult of peeling off. Thus the performance of the TFT and the normal display of the display can be ensured.

Specifically, the superficial metallic oxide on the metal layer can be removed by the washing process, wherein the washing process comprises steps of removing the superficial metallic oxide on the metal layer by washing the substrate on which a metal layer is formed with organic acid or ethanolamine solution. In addition, the washing agent used in the washing process should not have any adverse effect on the metal layer and can remove the metal oxide completely in a certain time. In such a way, the cycle time of the process will not be affected.

The washing process is further performed by washing the metal layer with organic acid or ethanolamine solution for more than 30 seconds at 25-40° C. For example, the substrate can be washed at room temperature. When the organic acid solution is used to wash, the organic acid and metallic ion in the metallic oxide will form complex, and thereby the metallic oxide will be dissolved and removed.

For example, when the metal layer is made of Cu, a superficial cupric oxide layer is formed on the metal electrode due to susceptibility of Cu to oxidation, and the electric conductivity of the metal layer will be affected. In the present invention, when the metal layer is made of Cu, a washing agent for cupric oxide is used to wash the substrate, and superficial cupric oxide on the metal layer can be removed.

Wherein, the metal layer can be either a metal film or a metal pattern formed by patterning the metal film by a patterning process. The metal pattern comprised a gate electrode, a source electrode, a drain electrode, a gate line, a data line and a common electrode, etc.

Specifically, the metal pattern comprises a gate electrode and/or a source-drain electrode.

The method for manufacturing the array substrate further comprises:
    forming a metal film,
    forming a metal pattern comprising a gate electrode by a one-time patterning process, and
    removing superficial metallic oxide on the metal pattern comprising the gate electrode by a washing process.

The method for manufacturing the array substrate further comprises:
    forming a metal film,
    forming a metal pattern comprising a source-drain electrode by a one-time patterning process, and removing superficial metallic oxide oft the metal pattern comprising source-drain electrode by a washing process.

The method for manufacturing the array substrate further comprises:

providing a base substrate, forming a first transparent conduction layer and a first metal film on the base substrate, forming a pattern of the first transparent conduction layer comprising a common electrode and forming a pattern of the first metal film comprising a gate electrode by a one-time patterning process, removing superficial metallic oxide on the pattern of the first metal film comprising the gate electrode by a washing process, forming a gate insulation layer, a semiconductor layer, an ohmic contact layer and a second metal film, forming a pattern of the semiconductor layer, a pattern of the ohmic contact layer, and a pattern of the second metal film comprising a source-drain electrode, removing superficial metallic oxide on the pattern of the second metal film comprising the source-drain electrode by a washing process, forming a passivation layer and forming a pattern of the passivation layer comprising a via hole by a one-time patterning process; and forming a second transparent conduction layer and forming a pattern of the second transparent conduction layer comprising a pixel electrode by a one-time patterning process, wherein the pixel electrode is connected with the drain electrode by the via hole.

Wherein, the technical solutions of the invention is suitable for various array substrate comprising a bottom-gate type array substrate, a top-gate type array substrate, a TN (twisted nematic) array substrate, a VA (vertical orientation) array substrate, an IPS (In plane switching) array substrate, a FFS (Fringe filed Switching) array substrate and an ADS (Advanced Super Dimension Switch) array substrate etc.

In another embodiment of the present invention, an array substrate manufactured by the above-mentioned method is provided, wherein a metal layer of the array substrate is not coated with superficial metallic oxide.

For the array substrate of the present invention, the superficial metallic oxide on the metal layer has been removed. Therefore, it will not have any adverse effect on the electric conductivity of the metal layer. In addition, a smooth surface will be provided for the metal layer, and the insulation layer coating on the metal layer will be difficult of peeling off. Thus the performance of TFT and the normal display of the display can be ensured.

In still another embodiment of the present invention, a display device comprising the above-mentioned array substrate is provided. Wherein, the structure of the array substrate is identical with the foregoing, so details are omitted here. In addition, the structure of other parts of display device can be referred to the prior art, so details are omitted here. The display device can be any product or parts having display function selected from a group consisting of liquid crystal panel electronic paper, LCD TV, liquid crystal display, digital album, cell-phone and panel computer etc.

A TFT-LCD can be classified as a vertical electric field type of TFT-LCD and a horizontal electric field type of TFT-LCD according to electric field direction for driving liquid crystal. For the vertical electric field type such as commonly used TN mode, a pixel electrode is needed to be formed on the TFT substrate and a common electrode is needed to be formed on the color film substrate. For a horizontal electric field type such as IPS mode, FFS mode and ADS mode, a pixel electrode and a common electrode are needed to be formed simultaneously on a TFT substrate. For different types of the array substrate, a metal layer is needed to be formed on the array substrate, but after a metal layer is formed, it is difficult to avoid superficial oxidation of the metal layer and appearance of metallic oxide. The performance of TFT will be affected. In order to solve this problem, the present invention provides a method for manufacturing an array substrate, which comprises removing superficial metallic oxide on the metal layer after the metal layer is formed.

Taking FFS type of array substrate as an example, the method for manufacturing the array substrate of the present invention will be illustrated in detail below in conjunction with the following examples.

Figure 2:
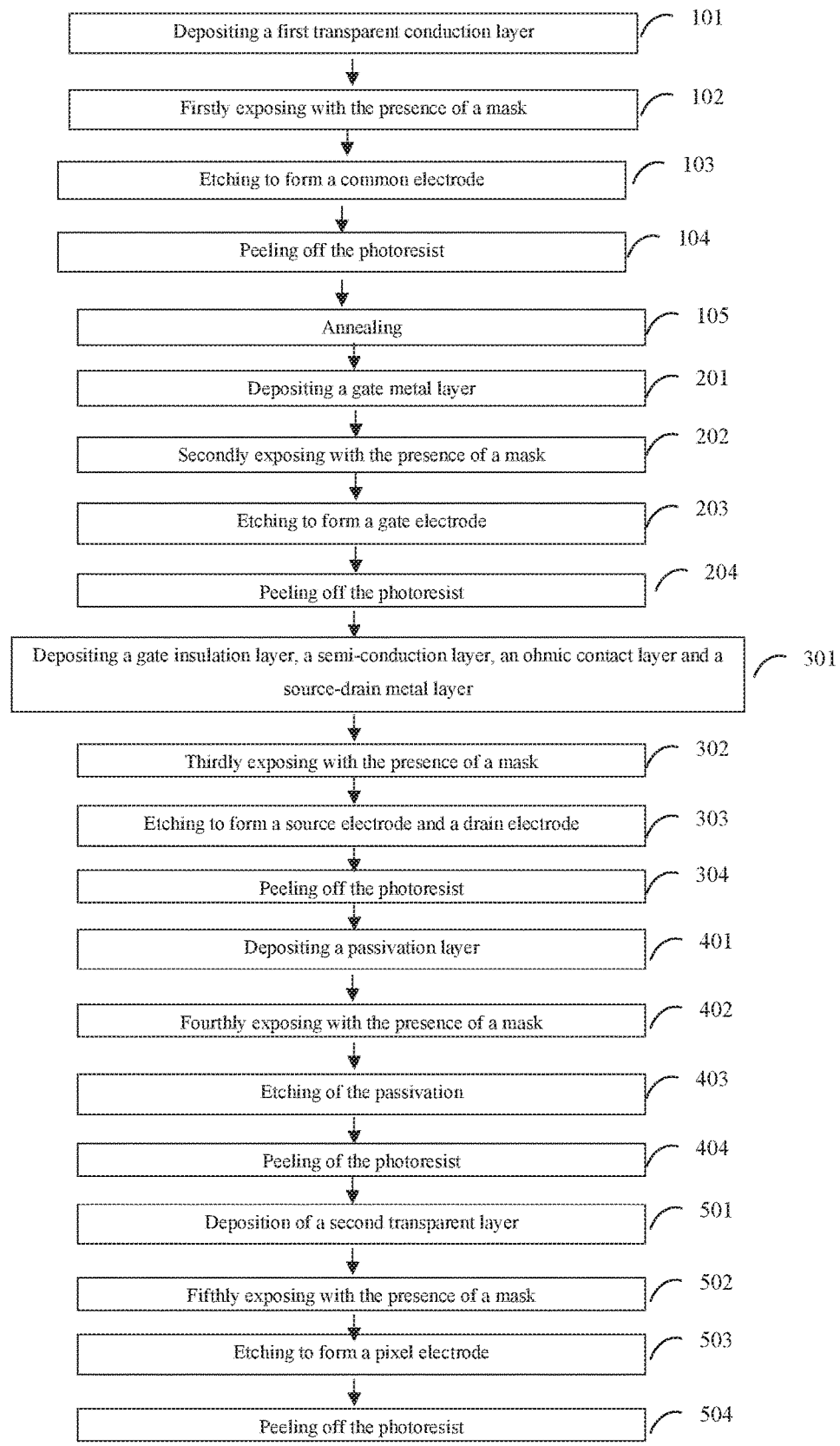
FIG. 2 is a flow chart showing a method for manufacturing an array substrate in the prior art.

FIG. 1 is a schematic diagram showing a part of an array substrate in the prior art. FIG. 2 is a flaw chart showing a method for manufacturing an array substrate in the prior art, comprising:

M1: forming a common electrode by a first patterning process, which comprises Step S101-Step S105.

Step S101: depositing a first transparent conduction layer on a base substrate, wherein the first transparent conduction layer can be made of ITO or IZO, Step S102: applying photoresist to the first transparent conduction layer, and exposing the first transparent conduction layer coated with the photoresist with the presence of a mask, Step S103: etching to form a common electrode after development, Step S104: peeling off the photoresist on the common electrode and forming a pattern of common electrode, Step S105: annealing the base substrate formed with the common electrode and turning amorphous ITO into crystalline ITO.

M2: forming a gate electrode by a second patterning process, which comprises steps:

Step S201: depositing a gate metal layer on the substrate subjected to M1, wherein the gate metal layer can be made of at least one selected from a group consisting of Cu, Pt, Ru, Au, Ag, Mo, Cr, Al, Ta and W, Step S202: applying a photoresist to the gate metal layer and exposing the gate metal layer coated with the photoresist with the presence of a mask, Step S203: etching to form a gate electrode and a gate line after development, Step S204: peeling off the photoresist on the gate electrode and the gate line and forming a pattern of the gate electrode and the gate line.

M3: forming a source electrode and a drain electrode by a third patterning process, which comprises steps:

Step S301: depositing a gate insulation layer, a semiconduction layer, an ohmic contact layer and a source-drain metal layer in turn on the substrate subjected to M2, wherein the source-drain metal layer can be made of at least one selected front a group consisting of Cu, Pt, Ru, Au, Ag, Mo, Cr, Al, Ta and W, Step S302: applying a photoresist to the source-drain metal layer and exposing the source-drain metal layer coated with the photoresist with the presence of a mask, Step S303: etching to form a pattern of the semi-conduction layer, a pattern of the ohmic contact layer, a pattern of the source electrode, the drain electrode and the data line after development, Step S304: peeling off the photoresist on the source electrode, the drain electrode and the data line and forming the patterns of the source electrode, the drain electrode and the data line.

M4: forming a pattern of a passivation layer by a fourth patterning process, which comprises steps:

Step S401: depositing a passivation layer on the substrate subjected to M3, wherein the passivation layer can be made of silicon nitride, Step S402: applying the photoresist to the passivation layer, and exposing the passivation layer coated with the photoresist with the presence of a mask, Step S403: etching the passivation layer pattern after development, Step S404: peeling off the photoresist on the passivation layer and forming a pattern of the passivation layer with a via hole.

M5: forming a pixel electrode by a fifth patterning process, which comprises steps:

Step S501: depositing a second transparent conduction layer on the substrate subjected to M4, wherein the second transparent conduction layer can be made of ITO or IZO, Step S502: applying a photoresist to the second transparent conduction layer, and exposing the second transparent conduction layer coated with the photoresist with the presence of a mask, Step S503: etching the second transparent conduction layer coated with photoresist development, Step S504: peeling off the photoresist on the second transparent conduction layer and forming a pattern of the pixel electrode, wherein the pixel electrode was connected with the drain electrode by a via hole.

As can be seen that, in the prior art the process for manufacturing the horizontal electric field type of array substrate was relatively complex, since five patterning processes were applied. When such metal as Cu, Pt, Ru, Au, Ag, Mo, Cr, Al, Ta and W was used to make the gate electrode, the source electrode and the drain electrode, metal oxide was apt to form on the gate electrode, the source electrode and the drain electrode. Therefore, the performance of TFT would be adversely affected. For example, when metal oxide was formed on the gate electrode, the impedance of the gate electrode would be increased and the electrical performance decreased. Moreover, it would lead to a rough surface of the gate electrode and peeling off of the gate insulation layer due to poor adhesiveness, and it would even lead to a short circuit. When the metal oxide was formed on the source electrode and the drain electrode, the contact impedance of the source electrode and the drain electrode would be increased, and the transmitting and switching of signals would be adversely affected. At the same time, it would cause the passivation layer to peel off due to the poor adhesiveness and it would even cause a broke-off of the pixel electrode.

Figure 3:
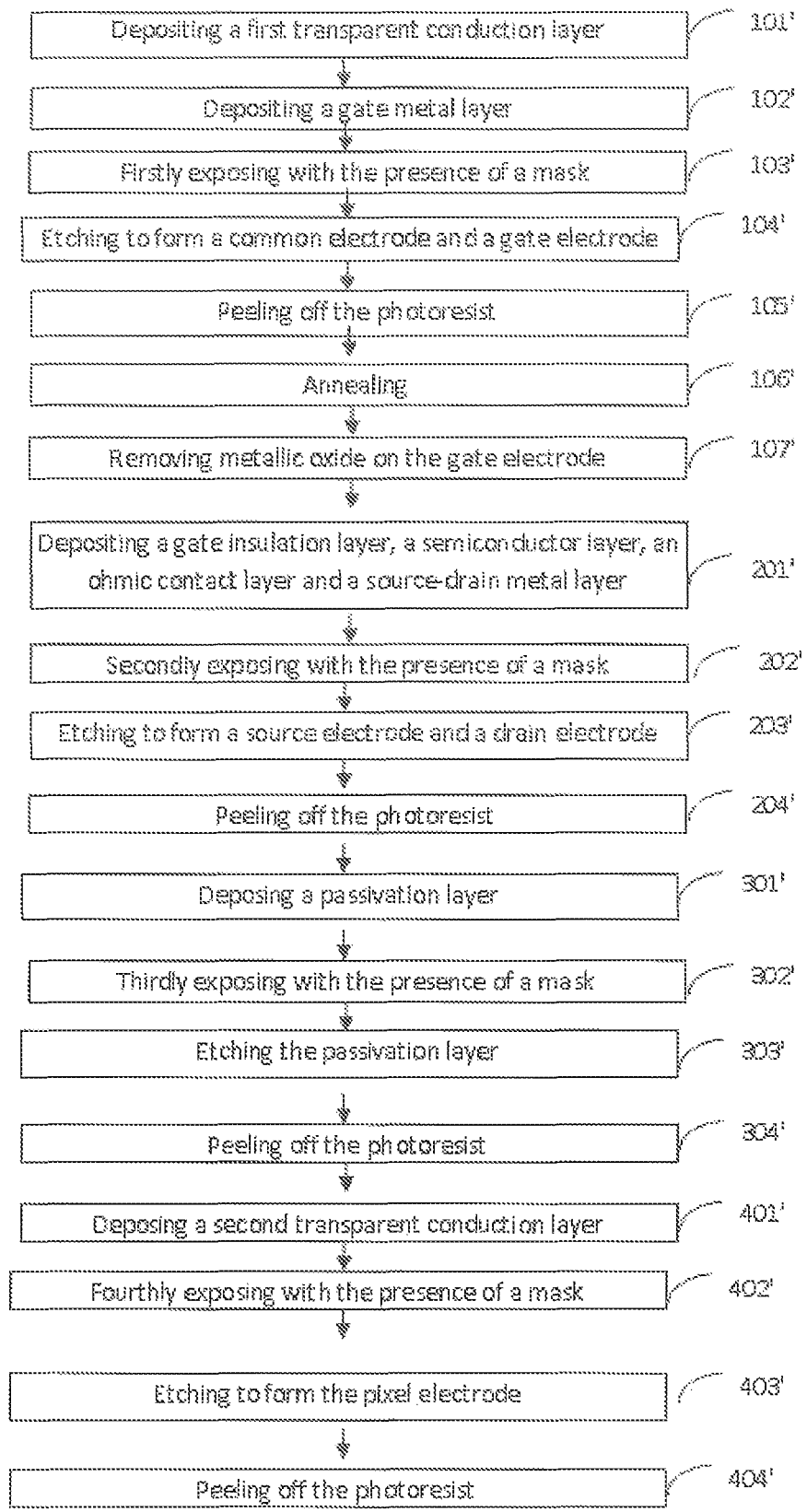
FIG. 3 is a flow chart showing the method for manufacturing the array substrate in one embodiment of the present invention.

To solve the above-mentioned technical problems, one embodiment of the present invention provides a method for manufacturing an array substrate, as shown in FIG. 3. Specifically, the embodiment comprises steps as follows:

M1': forming a common electrode and a gate electrode by a first patterning process, which comprises Step 101'-Step 107'.

Step 101': providing a base substrate and depositing a first transparent conduction layer on the base substrate.

Wherein, the base substrate can be a glass substrate or a quartzy substrate. Specifically, a first transparent conduction layer with the thickness of 300 Å~600 Å can be deposited by magnetron sputtering, thermal evaporation or other methods for forming a film. The first transparent conduction layer can be made of such as indium tin oxide (ITO) or indium zinc oxide (IZO).

Step 102': depositing a gate metal layer.

Specifically, a gate metal layer can be deposited on the substrate by sputtering or thermal evaporation, and the gate metal layer can be made of at least one selected from a group consisting, of Cu, Pt, Ru, Au, Ag, Mo, Cr, Al, Ta and W, preferably Cu.

Step 103': applying a photoresist to the gate metal layer, and exposing the gate metal layer coated with the photoresist with the presence of a mask.

Specifically, Half Tone Mask is used to expose.

Step 104': etching to form a common electrode 1 and a gate electrode 2 after development.

Specifically, the photoresist on a gate line is completely exposed and the photoresist on a pixel region is partly exposed, and the gate metal layer and the first transparent conductive layer are firstly etched to form the gate line and the common electrode. A gate metal layer of the pixel region is shows by ashing the photoresist, and then the gate metal layer is secondly etched to form the common electrode, the gate electrode and the gate line.

Step 105': peeling off a residual photoresist on the gate electrode, the gate line and the common electrode.

Step 106': annealing the common electrode to turn amorphous ITO into crystalline ITO.

Step 107': removing metallic oxide on the gate electrode and the gate line.

When the gate electrode and the gate line are made of metal susceptible to oxidation such as Cu, superficial metallic oxide is apt to form on the gate electrode and the gate line after annealing process and the performance of TFT will be adversely affected. In the method in this embodiment, the metallic oxide on the gate electrode and the gate line is removed by an additional washing process. In particular, the substrate is washed with a washing agent. The washing agent should have no adverse effect on the metal of which the gate electrode and the gate line are made. Moreover, it can completely remove the metal oxide in a certain period of time, and thus the process cycle time will not be affected. Specifically, when the gate electrode and the gate line are made of Cu, a superficial cupric oxide layer is apt to form on the gate electrode and the gate line due to susceptibility of Cu to oxidation. Under this circumstance, the electric conductivity of the gate electrode and the gate line is affected. In this embodiment, the washing agent for cupric oxide can be used to wash the substrate to remove the superficial cupric oxide on the gate electrode and the gate line.

M2': forming a source electrode, a drain electrode and a data line by a second patterning process, which comprises Step 201'-Step S204'.

Step S201': depositing a gate insulation layer 3, a semiconductor layer 4, an ohmic contact layer 5 and a source-drain, metal layer in turn on the substrate subjected to M2'.

Specifically, the gate insulation layer with the thickness of 300 Å~600 Å can be formed by depositing insulation material on the substrate subjected to M1 by a plasma enhanced chemical vapor deposition (PECVD) method, wherein the gate insulation layer can be made of such as oxide, nitride or nitrogen oxide. Specifically, the gate insulation layer can be made of silicon nitride. The gate insulation layer can be single, double or multi-layer structure.

The semiconductor layer can be deposited in turn on the gate insulation layer by magnetron sputtering, thermal evaporation or other methods for forming a film. Specifically, the semiconductor layer can be made of a-Si, and the source electrode and the drain electrode of TFT device are integrated on the a-Si. In order to reduce the resistance between the source electrode, the drain electrode and the semiconductor layer, an additional ohmic contact layer with good electric conductivity is provided between the source electrode, the drain electrode and die semiconductor layer. Specifically, the ohmic contact layer can be made of N+a-Si.

A source-drain metal layer can be deposited on the ohmic contact layer by magnetron sputtering, thermal evaporation or other methods for forming a film. The source-drain metal layer can be made of at least one selected from a group consisting of Cu, Pt, Ru, Au, Ag, Mo, Cr, Al, Ta and W, preferably Cu.

Step S202': applying a photoresist to the source-drain metal layer, and exposing the source-drain metal layer coated with the photoresist with the presence of a mask.

Step S203': etching to form the pattern of the semiconductor layer, the pattern of the ohmic contact layer, the source electrode, the drain electrode and the data line after development.

Step S204': peeling off the photoresist on the source electrode, the drain electrode and the data line and forming patterns of the source electrode 6-1, the drain electrode 6-2 and the data line.

When the source electrode, the drain electrode and the data line are made of metal susceptible to oxidation such as Cu, superficial metallic oxide is apt to form on the gate electrode and the gate line after annealing process, and the performance of TFT will be adversely affected. In the method in this embodiment, the metallic oxide on the source electrode, the drain electrode and the data line can be removed by an additional washing process. In particular, the substrate is washed with a washing agent. The washing agent should have no adverse effect on the metal of which the source electrode, the drain electrode and the data line are made. Moreover, it can completely remove the metal oxide in a certain period of time, and thus the process cycle time will not be affected. Specifically, when the source electrode, the drain electrode and the data line are made of Cu, a superficial cupric oxide layer is apt to form on source electrode, the drain electrode and the data line due to susceptibility of Cu to oxidation. Under this circumstance, the electric conductivity of the source electrode, the drain electrode and the data line is affected. In this embodiment, a washing agent for cupric oxide can be used to wash the substrate to remove the superficial cupric oxide on the source electrode, the drain electrode and the data line.

M3': forming a pattern of a passivation layer by a third patterning process, which comprises Step S301'-Step S304'.

Step S301': depositing a passivation layer on the substrate subjected to M2'.

Specifically, material of the passivation layer can be deposited on the substrate at a thickness of 1500 Å~2500 Å by magnetron sputtering, thermal evaporation or other methods for forming a film. Wherein the material of passivation layer can be selected from oxide and nitride. Specifically, the passivation layer could be made of silicon nitride.

Step S302': applying a photoresist to the passivation layer and exposing the passivation layer coated with the photoresist with the presence of a mask.

The material of the passivation layer is applied with the photoresist and a photoresist reserved area and a photoresist unreserved area is formed by exposing the photoresist with the presence of mask, wherein the photoresist reserved area is corresponding to an area of the pattern of the passivation layer and the photoresist unreserved area is corresponding to an area other than the area of the pattern of the passivation layer.

Step S303': etching the passivation layer 7 after development.

The photoresist in the photoresist reserved area is totally removed and the thickness of the photoresist in the photoresist unreserved area keeps unchanged after development. The material of the passivation layer in the photoresist unreserved area is totally etched by an etching process to form the passivation layer pattern 7 with a via hole.

Step S304': peeling off the photoresist on the passivation layer and forming a pattern of the passivation layer with a via hole.

M4: forming a pixel electrode 8 by a fourth patterning process, which comprises Step S S401'-Step S S404'.

Step S S401': depositing a second transparent conduction layer on the substrate subjected to M3'.

Specifically, a second transparent conduction layer with a thickness of 1500 Å~2500 Å can be deposited on the substrate subjected to M3' by magnetron sputtering, thermal evaporation or other methods for forming a film, wherein the second transparent conduction layer can be made of ITO or IZO.

Step S402': applying a photoresist to the second transparent conduction layer and exposing the second transparent conduction layer coated with the photoresist with the presence of a mask.

A photoresist reserved area and a photoresist unreserved area are formed by exposing the photoresist with the presence of mask, wherein the photoresist reserved area is corresponding to a area of the pattern of pixel electrode 8 and the photoresist unreserved area is corresponding to a area other than the area of the pattern of pixel electrode 8.

Step S403': etching the second transparent conduction layer coated with the photoresist after development.

The photoresist in the photoresist reserved area is totally removed and the thickness of the photoresist in the photoresist unreserved area keeps unchanged after development. The material of the passivation layer in the photoresist unreserved area is totally etched by a etching process to form a pattern of the pixel electrode 8.

Step S404': peeling off the photoresist on the second transparent conduction layer and forming a pattern of the pixel electrode 8, wherein the pixel electrode 8 is connected with the drain electrode 6-2 by the via hole.

Figure 4:
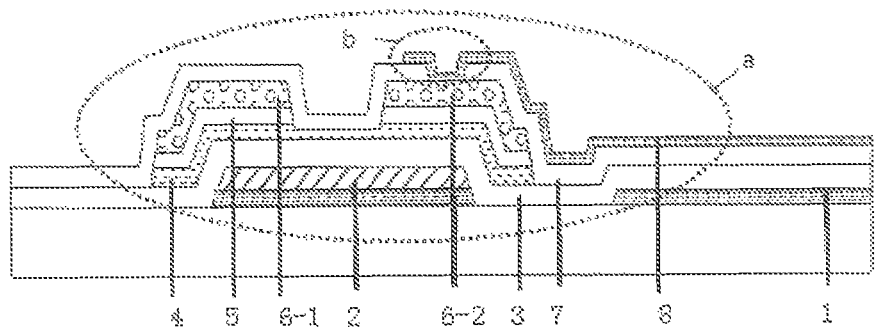
FIG. 4 is a schematic diagram showing a part of the array substrate in one embodiment of the present invention.

The array substrate as shown in FIG. 4 can be obtained through the processes of M1'-M4'. As can be seen, in the method for manufacturing the array substrate in the embodiment of the present invention, only four patterning processes are needed to obtain the array substrate. So the process is shortened and the production efficiency is improved. Thereby the production cost of the array substrate is reduced. In addition, in the method for manufacturing array substrate of this embodiment, the superficial metal oxide is removed from the metal layer after the formation of the metal layer, the conductive property of the metal layer wilt not be affected by the metallic oxide. Moreover, the smooth surface can be provided for the metal layer and the insulation layer coating the metal layer will be difficult of peeling off and the performance of the TFT and the normal display of the display can be ensured.

Above are the preferred embodiments of the invention, it should be pointed out that various modifications and improvements can be made without deviating from the principle illustrated in the present invention. These modifications and improvements are obvious to those skilled in the arts and should also be included within the protection scope of the present invention.

What is claimed is:

1. A method for manufacturing an array substrate having a substrate comprising
   forming a metal layer on the substrate, and
   removing superficial metallic oxide on the metal layer by a washing process
   wherein the washing process comprises removing the superficial metallic oxide on the metal layer by washing the substrate on which the metal layer is formed with organic acid or a ethanolamine solution.

2. The method for manufacturing the array substrate according to claim 1, wherein the washing process is performed at 25-40° C. for more than 30 seconds.

3. The method for manufacturing the array substrate according to claim 1, wherein the metal layer is a metal pattern formed by patterning a metal film by a patterning process.

4. The method for manufacturing the array substrate according to claim 3, wherein the metal pattern comprises a gate electrode and/or a source-drain electrode.

5. The method for manufacturing the array substrate according to claim 4 comprising
   forming the metal film,
   forming the metal pattern comprising the gate electrode by a one-time patterning process, and
   removing the superficial metallic oxide on the metal pattern comprising the gate electrode by the washing process.

6. The method for manufacturing the array substrate according to claim 4 comprising
   forming the metal film,
   forming the metal pattern comprising a source-drain electrode by a one-time patterning process, and
   removing the superficial metallic oxide on the metal pattern comprising source-drain electrode by the washing process.

7. The method for manufacturing the array substrate according to claim 4 comprising
   providing a base substrate,
   forming a first transparent conduction layer and a first metal film on the base substrate,
   forming a pattern of the first transparent conduction layer comprising a common electrode and forming a pattern of the first metal film comprising a gate electrode, by a one-time patterning process,
   removing the superficial metallic oxide on the pattern of the first metal film comprising the gate electrode by the washing process,
   forming a gate insulation layer, a semiconductor layer, an ohmic contact layer and a second metal film,
   forming a pattern of the semiconductor layer, a pattern of the ohmic contact layer and a pattern of the second metal film comprising the source-drain electrode,
   removing the superficial metallic oxide on the pattern of the second metal film comprising the source-drain electrode by the washing process,
   forming a passivation layer and forming a pattern of the passivation layer comprising a via hole by a one-time patterning process, and
   forming a second transparent conduction layer and a pattern of the second transparent conduction layer comprising a pixel electrode by a one-time patterning process, wherein the pixel electrode is connected with the drain electrode by the via hole.

8. The method for manufacturing the array substrate according to claim 1, wherein the metal layer is made of at least one selected from a group consisting of Cu, Pt, Ru, Au, Ag, Mo, Cr, Al, Ta and W.

* * * * *